United States Patent [19]

Uchikoshi

[11] Patent Number: 5,057,705
[45] Date of Patent: Oct. 15, 1991

[54] CLOCK FORMATION CIRCUIT WITH PHASE LOCKED LOOP CONTROL

[75] Inventor: Gohji Uchikoshi, Higashimurayama, Japan

[73] Assignee: Nakamichi Corporation, Kodaira, Japan

[21] Appl. No.: 413,619

[22] Filed: Sep. 28, 1989

[30] Foreign Application Priority Data

Oct. 4, 1988 [JP] Japan ................................. 63-250698
Dec. 16, 1988 [JP] Japan ................................. 63-163330[U]

[51] Int. Cl.⁵ ........................... H03K 5/00; H03K 5/13
[52] U.S. Cl. ..................................... 307/269; 307/262; 328/155; 331/1 A; 331/17
[58] Field of Search ............... 307/269, 262; 328/155; 331/1 A, 4, 11, 15, 17, 25, 23; 375/120, 121

[56] References Cited

U.S. PATENT DOCUMENTS

| | | | |
|---|---|---|---|
| 3,913,029 | 10/1975 | Caspari et al. | 331/4 |
| 3,946,329 | 3/1976 | Caspari et al. | 331/4 |
| 4,443,769 | 4/1984 | Aschwanden et al. | 331/17 |
| 4,649,353 | 3/1987 | Sonnenberg | 331/17 |
| 4,818,950 | 4/1989 | Ranger | 328/155 |
| 4,890,072 | 12/1989 | Espe et al. | 331/17 |

Primary Examiner—Timothy P. Callahan
Attorney, Agent, or Firm—Pearne, Gordon, McCoy & Granger

[57] ABSTRACT

A clock formation circuit to form, from a digital signal, a formation clock signal corresponding to a data clock controlling an inversion timing of the digital signal and providing an information signal of the phase difference between the digital signal and the formation clock signal and also providing a formation clock signal having a frequency controlled so as to be coincidental with a data clock frequency of the digital data signal and a phase not offset from that of the digital data signal.

8 Claims, 6 Drawing Sheets

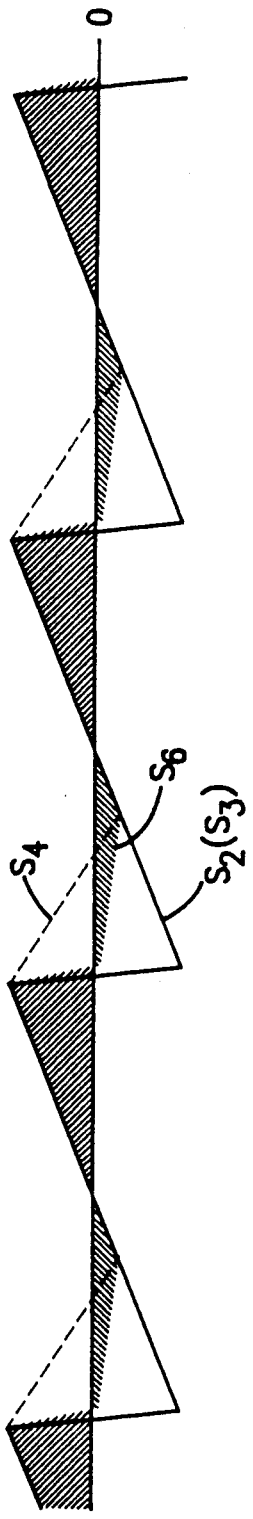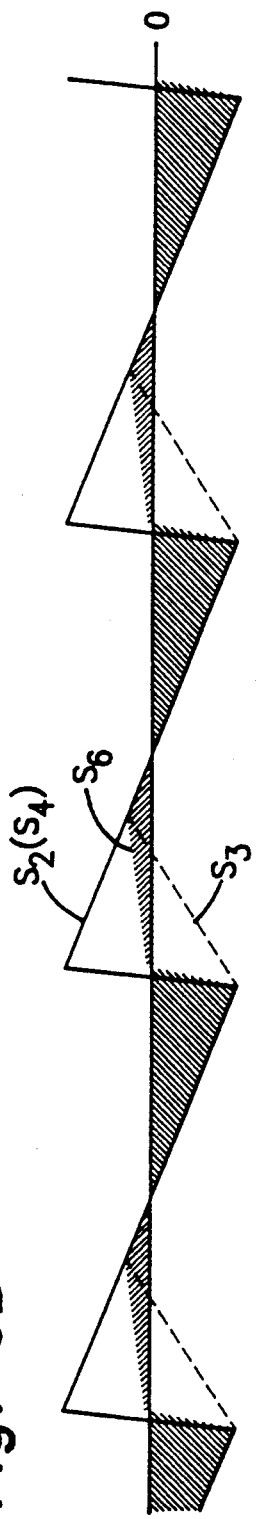

CLOCK FORMATION CIRCUIT WITH PHASE LOCKED LOOP CONTROL

BACKGROUND OF THE INVENTION

A clock formation circuit is used for a digital audio tape recorder (DAT) or a compact disk (CD). Such a clock formation circuit provides a clock signal corresponding to a reference clock signal from a digital data signal formed in synchronization with the reference clock signal.

In the prior art, the clock formation circuit compares a phase of the clock signal to be formed with an inversion timing of the digital data signal and then controls the oscillation frequency of the clock signal so that they are coincidental with each other.

However, the phase comparison is possible only when the frequency difference between the data clock controlling the inversion timing of the digital data signal and the clock signal to be formed falls within the predetermined pulling-in range.

Thus, if the frequency difference falls outside the range, phase comparison between them is impossible. This causes the correct formation clock signal to fail to be formed and prevents the DAT or CD from being positively operated.

SUMMARY OF THE INVENTION

Accordingly, it is a principal object of the invention to provide a clock formation circuit adapted to form a formation clock signal while the phase difference between a data clock and the formation signal is positively controlled so that the frequencies thereof can coincide.

In accordance with the present invention, there is provided a clock formation circuit for forming from a digital signal a formation clock signal corresponding to a data clock controlling an inversion timing of said digital signal comprising;

means to provide a phase difference information signal having a level varying in accordance with a phase difference between said digital signal and said formation clock signal;

means to provide a first envelope signal having a level increasing in accordance with said phase difference information signal and decreasing at a predetermined characteristic when said phase difference information signal rapidly decreases and a second envelope signal having a level decreasing in accordance with said phase difference information signal and increasing at a predetermined characteristic when said phase difference information signal rapidly increases;

means to provide an error correction information signal including at least an additive and integral information;

and means to provide said formation clock signal having a frequency controlled on said error correction information signal.

BRIEF DESCRIPTION OF THE DRAWINGS

The above and other objects and features of the invention will be apparent from the description of the embodiments of the invention with reference to the accompanying drawings in which;

FIGS. 6A and 6B illustrate principles of the relation of signals of FIG. 5.

DETAILED DESCRIPTION OF THE EMBODIMENTS

Figure 1:
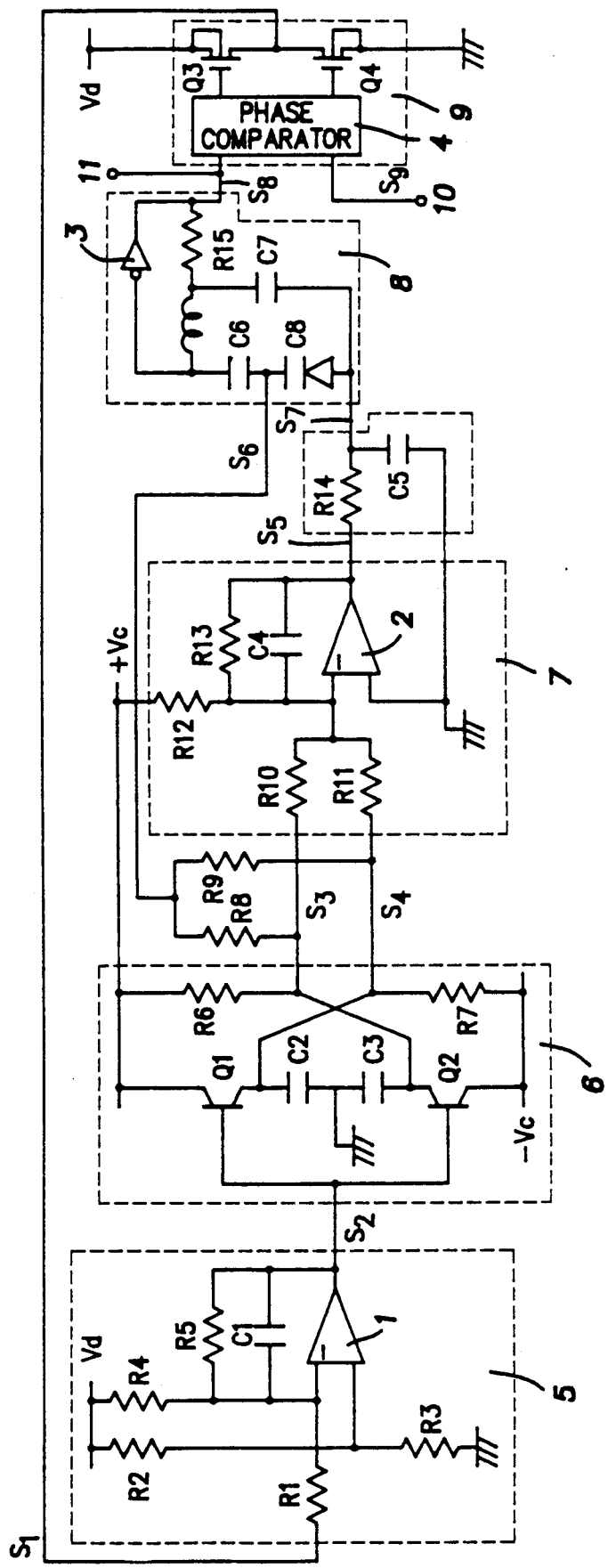
FIG. 1 is a schematic diagram of a clock formation circuit constructed in accordance with one embodiment of the invention.

Referring now to FIG. 1, there is illustrated a clock formation circuit constructed in accordance with one embodiment of the invention. A discrimination pulse signal $s_1$ is applied through a resistor R1 to an inversion input terminal of an operational amplifier 1 and a source voltage Vd is applied through a resistor R4 to the inversion input terminal thereof. The operational amplifier 1 has a non-inversion input terminal, to which the source voltage Vd is applied through a resistor R2 and also which is connected to ground through a resistor R3. A resistor R5 and a capacitor C1 are connected in parallel across the inversion input terminal and an output terminal of the operational amplifier 1.

An integrator is formed by the operational amplifier 1, the resistors R1 through R5 and the capacitor C1 and corresponds to a pulse width-voltage conversion circuit (referred to as voltage conversion circuit hereinbelow) 5 to supply a discrimination voltage signal $s_2$ having a level varying in accordance with the pulse width of the discrimination pulse signal $s_1$.

Across emitters of transistors Q1, and Q2 which have bases connected to the output terminal of the operational amplifier 1, are connected capacitors C2 and C3 in series, which are commonly connected to ground. A negative voltage source $-Vc$ is connected through a resistor R7 to the emitter of the transistor Q1 while a positive voltage source $+Vc$ is connected through a resistor R6 to the emitter of the transistor Q2. An envelope detection circuit 6 is formed by the transistors Q1 and Q2, the capacitors C2 and C3 and the resistors R6 and R7 and serves to detect envelope signals $s_4$ and $s_3$ having extremely high and low values of the discrimination voltage signal $s_2$, respectively.

To an inversion input terminal of an operational amplifier 2 is applied through resistors R11, R10, and R12 the envelope signal $s_4$ of extremely high value, the envelope signal $s_3$ of extremely low value and the positive voltage source $+Vc$, respectively. A non-inversion input terminal of the operational amplifier 2 is connected to ground and a resistor R13 and a capacitor C4 are connected in parallel across the inversion input terminal and an output terminal of the operational amplifier 2. An integrator is formed by the operational amplifier 2, the resistors R10 through R13 and the capacitor C4 and corresponds to an integration and composition circuit 7 to supply a composite integral signal $s_5$ of the envelope signals $s_3$ and $s_4$.

A variable capacitance diode (varicap) C8, capacitors C6 and C7 and a coil L1 are connected in series to each other and a resistor R15 and an inverter 3 are connected in series across terminals of the coil L1. A composite signal $s_6$ of the envelope signals $s_3$ and $s_4$ is applied through resistors R8 and R9 to a connection point of the varicap C8 and the capacitor C6 and a frequency error signal $s_7$ formed by filtering the integral signal $s_5$ through a filter of a resistor R14 and a capacitor C5 is applied to a connection point of the varicap C8 and the capacitor C7. A voltage control oscillator (referred to as VCO hereinbelow) 8 is formed by the varicap C8, the capacitors C6 and C7, the coil L1, the resistor R15 and the inverter 3. The varicap C8 of the VCO 8 has a capacitance varying in accordance with a differential voltage between the applied signals $s_6$ and $s_7$ to control the oscillation frequency of the VCO 8.

A phase comparator 4 serves to compare the phase of a formation clock signal $s_8$ formed by the VCO 8 and output from an output terminal 11 with that of a digital data signal (referred to as D-data signal hereinbelow) $s_9$ supplied through an input terminal 10 in accordance with a regulation described later to control field effect transistors (FET) Q3 and Q4 to output a discrimination pulse signal $s_1$ therefrom. A phase comparison circuit 9 is formed by the phase comparators 4 and FET Q3 and Q4.

Operation of the clock formation circuit of the invention will hereafter be described with reference to FIGS. 3 through 6.

Figure 4A:
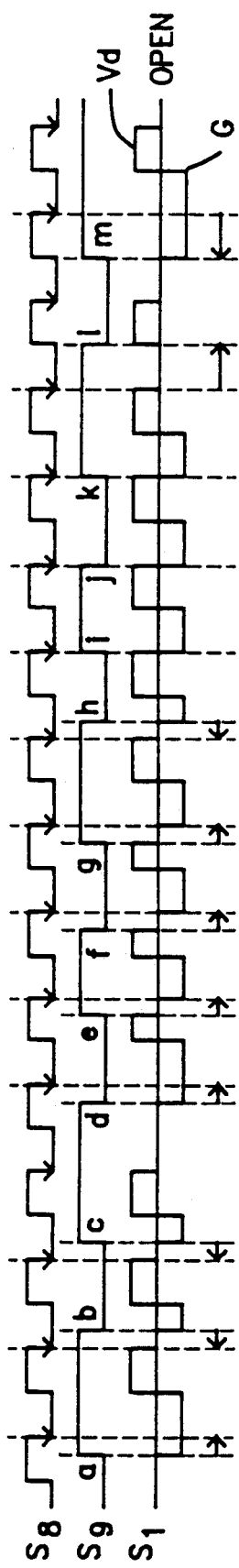
FIGS. 4A through 4C illustrate waveforms of formation clock signals, digital data signals and discrimination pulse signals in accordance with the invention.
Figure 4B:
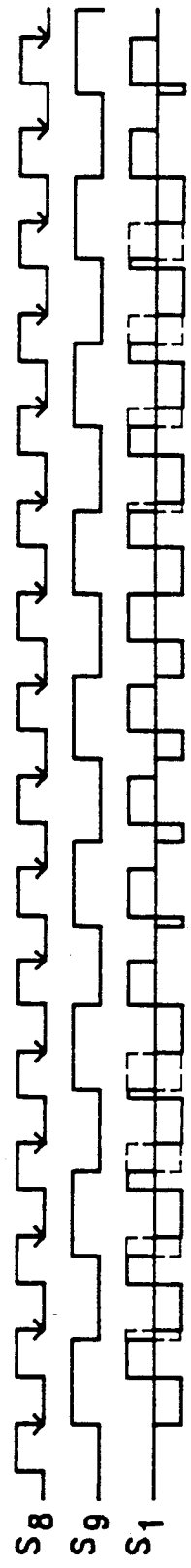
Figure 4C:
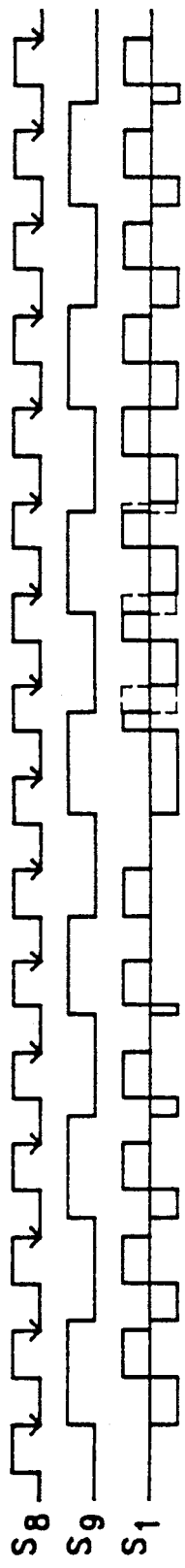

The formation clock signal $s_8$ and the D-data signal $s_9$ having their phases compared with each other by the phase comparison circuit 9 and the discrimination pulse signal $s_1$ formed by the comparison are shown in FIGS. 4A through 4C.

The phase comparison circuit 9 is operated in accordance with the following conditions.

(1) The discrimination pulse signal $s_1$ is at the state of ground level (referred to as "L" level state hereinbelow) in synchronization with an inversion of state of the D-data signal $s_9$ and is at the state of level of the source voltage Vd (referred to as "H" level state hereinbelow) and at the open state in synchronization with a change from "L" state to "H" state of the formation clock signal $s_8$ and a change from "H" state to "L" state thereof, respectively.

FIG. 4A shows how the discrimination pulse signal $s_1$ occurs in accordance with the aforementioned condition in synchronization with the state inversions a, b and c of the D-data signal $s_9$.

(2) The discrimination pulse signal $s_1$ is at the open state when the state inversion of the following D-data signal $s_9$ is detected before the discrimination pulse signal $s_1$ changes from the "H" level state to the open state while the signals are doubled.

FIG. 4A shows how the discrimination pulse signal $s_1$ occurs in accordance with the aforementioned condition in synchronization with the state inversions d, e and f of the D-data signal $s_9$. (3) The phase comparison circuit 9 is operated in the same manner as the case in which a lowering-down of the D-data signal $s_9$ is previously detected when lowering-down of the D-data signal $s_9$ and raising-up of the formation clock signal $s_8$ are simultaneously detected, and it is operated in the same manner as the case in which raising-up of the formation clock signal $s_8$ is previously detected when raising-up of the D-data signal $s_9$ and raising-up of the formation clock signal $s_8$ are simultaneously detected.

FIG. 4A shows how the discrimination pulse signal $s_1$ occurs in accordance with the aforementioned condition in synchronization with the state inversions 1 and m of the D-data signal $s_9$.

The "H" level state, the "L" level state and the open state of the discrimination pulse signal $s_1$ are formed by closing and opening the FET Q3 and Q4 by the control of the phase comparator 4, but the description of details thereof will be omitted.

As noted from the figure, a ratio of state time of the discrimination pulse signal $s_1$ supplied under the aforementioned conditions varies in proportion to a difference between the phases on the inversion of state of the D-data signal $s_9$ and on lowering-down of the formation clock signal $s_8$. Thus, it will be noted that the ratio of "H" level state time relative to "L" level state time becomes larger at the advance state of the formed clock signal $s_8$ as indicated by an arrow of leftward direction in FIG. 4A while the ratio of "L" level state time relative to "H" level state time becomes larger at the delay state of the formed clock signal $s_8$ as indicated by an arrow of rightward direction in FIG. 4A. Also, the state inversions i, j and k of the D-data signal $s_9$ as shown in FIG. 4A are consistent with lowering-down of the formation clock signal $s_8$, and in this case, the ratio of state time of "H" and "L" levels of the discrimination signal $s_1$ become equal to each other.

Figure 5:
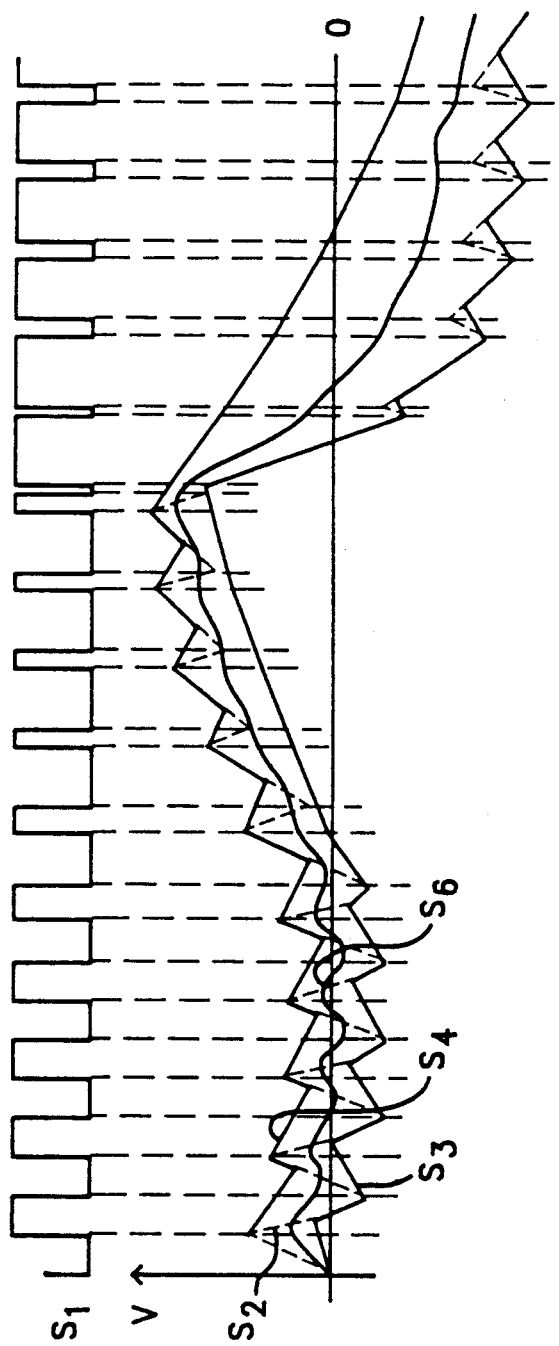
FIG. 5 illustrates a relation of a discrimination voltage signal, two envelope signals and a composite signal thereof.

Waveforms of the signals supplied to and from the voltage conversion circuit 5 are shown in FIG. 5.

The voltage conversion circuit 5 repeats charging and discharging in accordance with the state variation of the discrimination pulse signal $s_1$ at a time constant determined by the resistor R5 and the capacitor C1 to generate the discrimination voltage signal $s_2$ indicated by a dotted line and approaching the voltage level determined by the ratio of state time of "H" and "L" levels of the discrimination pulse signal $s_1$, including ripple.

In this embodiment, the value of the resistor R2 is set to be equal to that of the resistor R3 while the value of the resistor R4 is set to be equal to that of the resistor R5, so that the discrimination voltage signal $s_2$ approaches 0V when the phase difference never occurs and therefore when the ratio of state time of "H" and "L" levels of the discrimination pulse signal $s_1$ is the same as each other. Thus, it will be noted that the discrimination voltage signal $s_2$ approaches a predetermined positive value when the ratio of state time of "L" level of the discrimination pulse signal $s_1$ is larger and it approaches a predetermined negative value when the ratio of state time of "H" level of the discrimination pulse signal $s_1$ is larger.

Operation of the envelope detection circuit 6 will be described with reference to FIG. 5.

The emitter voltage of the transistor Q1 corresponding to the voltage level of the envelope signal $s_4$ increases approximately corresponding to the discrimination voltage signal $s_2$ when the latter is at the state of increase and decreases at the discharge characteristic of the time constant determined by the capacitor C2 and the resistor R7 when the discrimination voltage signal $s_2$ is at the state of decrease. On the other hand, the emitter voltage of the transistor Q2 corresponding to the voltage level of the envelope signal $s_3$ decreases approximately corresponding to the discrimination voltage signal $s_2$ when the latter is at the state of decrease and increases at the discharge characteristic of the time constant determined by the capacitor C3 and the resistor R6 when the discrimination voltage signal $s_2$ is at the state of increase.

Thus, when the discrimination voltage signal $s_2$ has a gentle approaching velocity as shown in FIG. 5, the envelope signal $s_4$ has an extremely large ripple value while the envelope signal $s_3$ has an extremely small ripple value. On the other hand, when the discrimination voltage signal $s_2$ has a large approaching velocity and, as a result, when the level rapidly decreases, for example, the envelope signal $s_4$ cannot follow the extremely large ripple value and, when the level rapidly increases, the envelope signal $s_3$ cannot follow the extremely small ripple value.

A composite signal $s_6$ of the envelope signals $s_3$ and $s_4$ through the respective resistors R8 and R9 is also shown in FIG. 5. The composite signal $s_6$ has an approximately average level with the ripple components decreasing relative to the discrimination voltage signal $s_6$ as shown in FIG. 5, but it cannot follow the ripple value when the approaching velocity of the discrimination voltage signal $s_2$ is larger.

The VCO 8 serves to receive the composite signal $s_6$ to change the oscillation frequency f in accordance with the level thereof.

It is now supposed that a frequency error signal (referred to as an error signal hereinbelow) $s_7$ is kept at a predetermined constant level so as to produce a reference voltage Vr having a reference oscillation frequency fr across the varicap C8 on the condition that there is no phase difference between the D-data signal $s_9$ and the formation clock signal $s_8$ and that the composite signal $s_6$ extremely approaches OV. As the inversion distance of the D-data signal $s_9$ is gradually shorter, the phase of the D-data signal $s_9$ advances relative to that of the formation clock signal $s_8$ and, as a result, the level of the composite signal $s_6$ becomes higher so that the frequency of the formation clock signal $s_8$ becomes also higher. This causes the phase difference between the signals $s_6$ and $s_8$ to follow it so as to have a predetermined relation therebetween. The phase difference corresponds to that with which the level of the composite signal $s_6$ increases sufficiently for producing the frequency of the formation clock signal $s_8$ higher than the oscillation reference frequency fr.

Thus, in the supposition of the error signal $s_7$ being kept at the predetermined constant level, the circuit of FIG. 1 is operated to change the frequency of the formation clock signal $s_8$ in accordance with the variation in frequency of the D-data signal $s_9$ so that the phase difference between the signals $s_8$ and $s_9$ is kept constant. If the frequency f of the formation clock signal $s_8$ is higher than the reference oscillation frequency fr, then the phase of the formation clock signal $s_8$ relative to that of the D-data signal $s_9$ delays approximately in proportion to the difference between the frequencies. If it is lower than the reference oscillation frequency fr, then the phase of the formation clock signal $s_8$ advances.

Operation of the integration and composition circuit 7 to generate the error signal $s_7$ will be described hereinbelow.

The integration and composition circuit 7 produces an integral signal $s_5$ of reverse polarity formed by integrating the composite signal $s_6$. The circuit 7 is so biased by the resistor R12 that the level of the integral signal $s_5$ becomes −Vr to provide the reference terminal voltage Vr when the composite signal $s_6$ is kept at OV on the condition that the formation clock signal $s_8$ has the reference frequency fr.

Thus, as the phase of the D-data signal $s_9$ begins to advance relative to the formation clock signal $s_8$, the level of the composite signal $s_6$ becomes higher and the frequency of the formation clock signal $s_8$ becomes higher so as to rapidly follow the variation in the D-data signal $s_9$. At that time, the level of the error signal $s_7$ formed by smoothing the integral signal $s_5$ decreases at the ratio of variation proportional to the level of the composite signal $s_6$. This corrects the frequency of the formation clock signal $s_8$ while the phase difference occurs. When there is no phase difference so that the composite signal $s_6$ becomes OV, the error signal $s_7$ becomes constant and is kept at its level.

Thus, assuming that the error signal $s_7$ is kept at a constant level as aforementioned, the circuit of FIG. 1 is operated so as to hold the constant phase difference between the signals $s_8$ and $s_9$. Although the phase difference occurs in accordance with the frequency f, the circuit is operated to correct the formation clock signal $s_8$ so that there is no phase difference and to keep the level of the error signal $s_7$ for its correction.

Operation of the circuit will be described with reference to FIGS. 3 through 6 in the case that there is an offset between the frequency of the formation clock signal $s_8$ and virtual clocks (referred to as data clocks hereinbelow) controlling the inversion timing of the D-data signal $s_9$.

FIG. 4B shows how the discrimination pulse signal $s_1$ varies in the case of the frequency of the formation clock signal $s_8$ being lower relative to the data clocks of the D-data signal $s_9$. As apparent from this figure, the delay of the phase of the formation clock signal $s_8$ relative to that of the D-data signal $s_9$ becomes gradually larger and it is understood as the advance state when the delay exceeds 180 degrees. The advance state gradually decreases until it is changed into the delay state. Thus, the delay state and the advance state are repeated. The center level of the ripple of the discrimination voltage signal $s_2$ formed on the discrimination pulse signal $s_1$ gradually increases from the time when the state is understood as the advance state to the time when it becomes the delay state of 180 degrees and rapidly decreases when it changes the state. Thus, this is repeated.

The composite signal $s_6$ formed on the discrimination voltage signal $s_2$ having the repetitively varying waveform varies with level approximately identical to that of the discrimination voltage signal $s_2$ when the center of the ripple of the discrimination voltage signal $s_2$ gently varies as shown in FIG. 5. However, it cannot follow the rapid variation approximately at the offset of 180 degrees.

FIG. 6A illustrates the principle of the waveforms of the signals $s_2$ and $s_6$ for the understanding of the relation therebetween.

It is understood that in the case of the frequency of the formation clock signal $s_8$ being lower relative to the data clocks of the D data signal $s_9$, the discrimination voltage signal $s_2$ has a waveform nearly similar to the saw-toothed waveform, as shown in FIG. 6A. For its explanation, the waveform has the ripple components omitted. In this case, although the envelope signal $s_3$ of the extremely small value varies corresponding to the discrimination voltage signal $s_2$, the envelope signal $s_4$ of the extremely large value cannot follow the rapid variation of the discrimination voltage signal $s_2$ and has the waveform varying as indicated by a dotted line in FIG. 6A. Although, in practice, the dotted line becomes the discharge characteristic determined by the capacitor C2 and the resistor R7 while the envelope signal $s_4$ cannot follow the discrimination voltage signal $s_2$, it is linearly illustrated for its explanation. Thus, the size of positive area (indicated by rightward hatching) of the composite signal s₆ is larger than that of negative area (indicated by leftward hatching) thereof and, therefore, the level of the frequency error signal s₇ obtained by filtering the integral signal s₅ of reverse polarity, which is in turn formed by integrating the composite signal s₆, continues to decrease so that the voltage across the varicap C8 increases whereby the frequency of the formation clock signal s₈ becomes higher until it approaches that of the data clocks.

FIG. 4C shows how the discrimination pulse signal s₁ varies in the case of the frequency of the formation clock signal s₈ being higher relative to the data clocks of the D-data signal s₉. In this case, since the discrimination voltage signal s₂ has a waveform nearly similar to a saw-toothed waveform as shown in FIG. 6B, the envelope signal s₄ of the extremely large value varies corresponding to the discrimination voltage signal s₂, but the envelope signal s₃ of the extremely small value cannot follow the rapid variation of the discrimination voltage signal s₂ and has the waveform varying as indicated by a dotted line in FIG. 6B. Although, in practice, the dotted line becomes the charge characteristic determined by the capacitor C3 and the resistor R6 while the envelope signal s₃ cannot follow the discrimination voltage signal s₂, it is linearly illustrated for its explanation. Thus, the size of the positive area (indicated by rightward hatching) of the composite signal s₆ is smaller than that of the negative area (indicated by leftward hatching) thereof and, therefore, the level of the frequency error signal s₇ continues to increase so that the voltage across the varicap C8 decreases whereby the frequency of the formation clock signal s₈ decreases until it approaches that of the data clocks.

Thus, the clock formation circuit serves to control the frequency of the formation clock signal s₈ so that it is consistent with the frequency of the data clocks and also to control the phase of the formation clock signal s₈ so that it is consistent with that of the data clocks.

Figure 2:
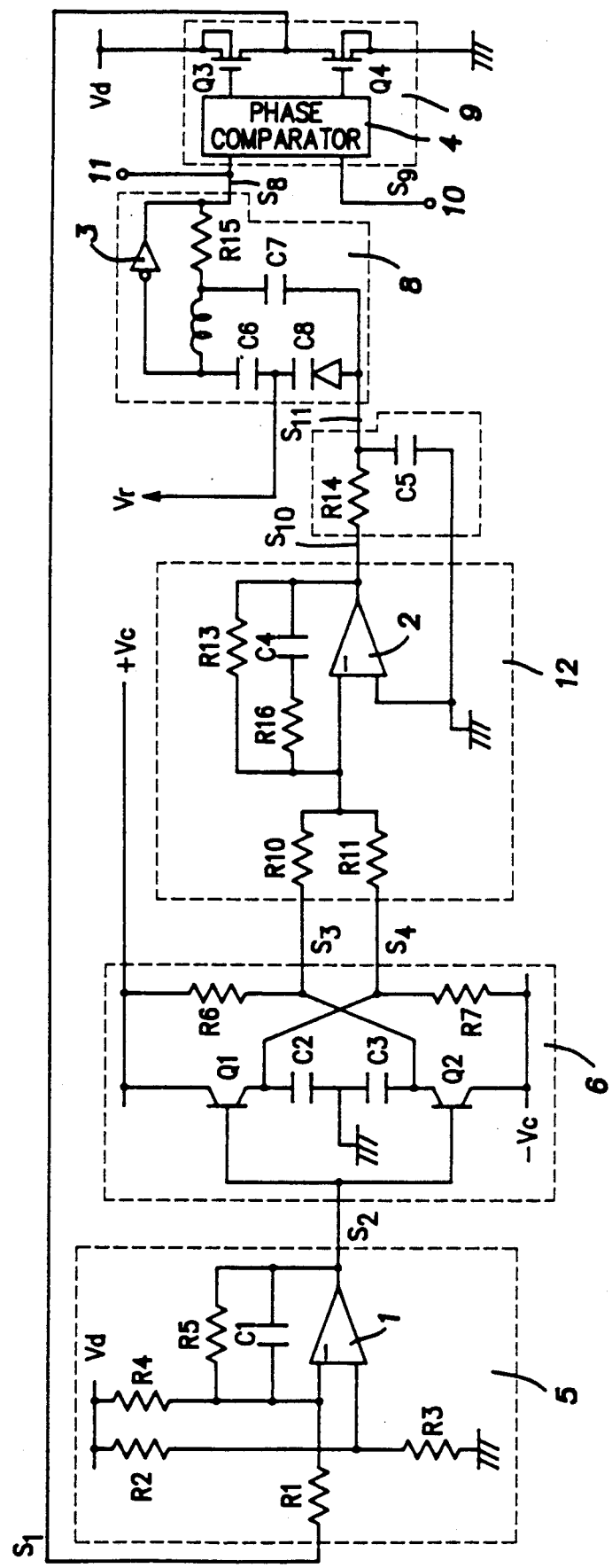
FIG. 2 is a schematic diagram of a clock formation circuit constructed in accordance with another embodiment of the invention.

FIG. 2 shows a clock formation circuit constructed in accordance with another embodiment of the invention. The same reference numerals designate the same components. The clock formation circuit of FIG. 2 is substantially identical to that of FIG. 1, except that the resistors R8 and R9 of FIG. 1 are omitted and a reference voltage Vr is applied in place of the composite signal S₆ to the connection of the varicap C8 and the capacitor C6. Furthermore, a resistor R16 is provided which is connected in series to the capacitor C4 between the output terminal and the inversion input terminal of the operational amplifier 2.

Figure 3A:
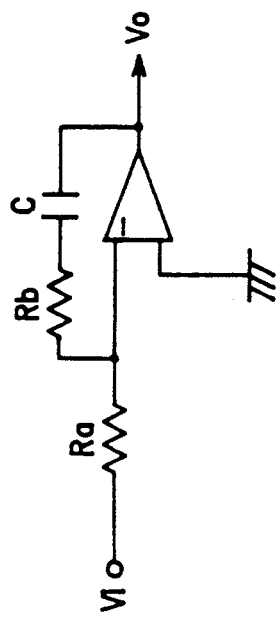
FIGS. 3A and 3B illustrate characteristics of varicaps used in the circuits of FIGS. 1 and 2.
Figure 3B:
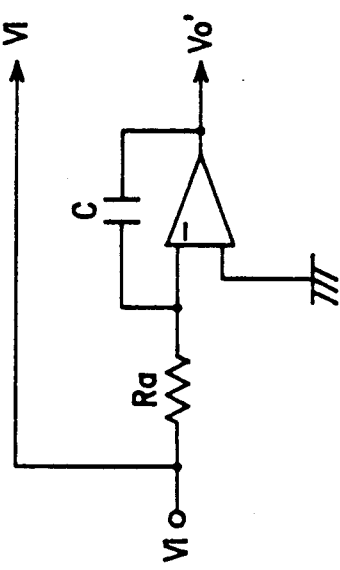

In the clock formation circuits of FIGS. 1 and 2, there will be considered simple models of FIGS. 3A and 3B in order to compare variation characteristics of the signal voltages applied across the terminals of the varicap C8 of the VCO 8. The differential voltage (Vi−Vo') corresponds to the terminal voltage across the varicap C8 of FIG. 1 while the voltage Vo corresponds to the terminal voltage across the varicap C8 of FIG. 2.

Since the reference voltage Vr used in the circuits of FIGS. 1 and 2 can be optionally set, the description thereof will be omitted. Also, since the discharging resistor R13 connected in parallel to the capacitor C4 is commonly used for the circuits of FIGS. 1 and 2, the comparison thereof will be omitted.

In the circuit of FIG. 3A, a transfer function Ga between Vi and (Vi−Vo') can be expressed by the following expression:

$$Ga = (1 + s \cdot C \cdot Ra)/s \cdot C \cdot Ra$$

On the other hand, in the circuit of FIG. 3B, a transfer function Gb between Vi and Vo can be expressed by the following expression:

$$Gb = (1 + s \cdot C \cdot Rb)/s \cdot C \cdot Ra$$

Accordingly, it will be noted that the transfer functions Ga and Gb have at least the same tendency characteristic and have the same characteristic if the value of the resistor Ra is equal to that of the resistor Rb.

This shows that the terminal voltage across the varicap C8 of FIG. 1 corresponding to the differential voltage of the composite signal S₆ and the error signal S₇ varies at the characteristic of at least the same tendency as the terminal voltage of the varicap C8 of FIG. 2 corresponding to the differential voltage of the reference voltage Vr and a correction error information signal S₁₁. This means that the clock formation circuit of FIG. 2 operates in the same manner as that of FIG. 1.

Although some embodiments of the invention have been illustrated and described with reference to the accompanying drawings, it will be understood by those skilled in the art that they are by way of examples, and that various changes and modifications may be made without departing from the spirit and scope of the invention. For example, the phase comparison circuits 4 and the voltage conversion circuits 5 of FIGS. 1 and 2 may be modified so long as they have the similar characteristics. Furthermore, the resistors R6 and R7 of the envelope detection circuits 6 of FIGS. 1 and 2 may be replaced by constant current source circuits, respectively. Furthermore, there can be obtained a formation clock signal having a frequency multiplied by an integral number by applying the formation clock signal S₈ through a divider to the phase comparator 4. Thus, it should be understood that the invention is intended to be defined only by the appended claims.

What is claimed is:

1. A clock formation circuit for forming from a digital data signal a formation clock signal corresponding to data clocks controlling an inversion timing of said digital data signal comprising:

phase difference information output means to compare a phase of said digital data single with that of said formation clock signal to provide a phase difference information signal having a saw-tooth periodical waveform when a frequency of said data clocks is different from that of said formation clock signal, said phase difference information signal having a level varying in accordance with a phase difference between said digital data signal and said formation clock signal;

means to provide a first envelope signal having a level increasing in accordance with said phase difference information signal and decreasing at a predetermined characteristic when said phase difference information signal rapidly decreases and a second envelope signal having a level decreasing in accordance with said phase difference information signal and increasing at a predetermined characteristic when said phase difference information signal rapidly increases;

means having an addition function and an integration function to provide a correction error information signal including at least an information identical to an operation information obtained by adding and then integrating said first and second envelope signals;

and means to provide said formation clock signal having a frequency controlled on said correction error information signal.

2. A clock formation circuit as set forth in claim 1, and wherein said means to provide a correction error information signal comprises an inversion type amplifier having an inversion input terminal to which said first and second envelope signals are applied through resistors, respectively, and at least either of a capacitor and a series connection of a capacitor and a resistor connected between said inversion input terminal and an output terminal thereof.

3. A clock formation circuit for forming from a digital data signal a formation clock signal corresponding to data clocks controlling an inversion timing of said digital data signal comprising:

phase difference information output means to compare a phase of said digital data signal with that of said formation clock signal to provide a phase difference information signal having a saw-tooth periodical waveform when a frequency of said data clocks is different from that of said formation clock signal, said phase difference information signal having a level varying in accordance with a phase difference between said digital data signal and said formation clock signal;

envelope signal output means to provide a first envelope signal having a level increasing in accordance with said phase difference information signal and decreasing at a predetermined characteristic when said phase difference information signal rapidly decreases and a second envelope signal having a level decreasing in accordance with said phase difference information signal and increasing at a predetermined characteristic when said phase difference information signal rapidly increases;

correction error information signal formation means having an addition function and an integration function to provide a correction error information signal including both an addition information of said first and second envelope signals and an integral information obtained by integrating said addition information;

and formation clock signal output means to provide said formation clock signal having a frequency controlled on said correction error information signal.

4. A clock formation circuit as set forth in claim 3, and wherein said envelope signal output means comprises a pair of transistors connected in series to each other so that said transistors have emitter connected through respective capacitors connected to each other and bases to which said phase difference information signal is applied and having output terminals provided at connections of said emitters and said capacitors to provide said first and second envelope signals, respectively.

5. A clock formation circuit as set forth in claim 4, and wherein said formation clock signal output means comprises voltage control oscillator including a variable capacitor diode across which are applied said correction error information signal and a reference voltage.

6. A clock formation circuit for forming from a digital data signal a formation clock signal corresponding to data clocks controlling an inversion timing of said digital data signal comprising:

phase difference information output means to compare a phase of said digital data signal with that of said formation clock signal to provide a phase difference information signal having a saw-tooth periodical waveform when a frequency of said data clocks is different from that of said formation clock signal, said phase difference information signal having a level varying in accordance with a phase difference between said digital data signal and said formation clock signal;

envelope signal output means to provide a first envelope signal having a level increasing in accordance with said phase difference information signal and decreasing at a predetermined characteristic when said phase difference information signal rapidly decreases and a second envelope signal having a level decreasing in accordance with said phase difference information signal and increasing at a predetermined characteristic when said phase difference information signal rapidly increases;

integration means having an addition function and an integration function to provide an additive and integral information signal identical to a signal obtained by adding and then integrating said first and second envelope signals;

and formation clock signal output means to provide said formation clock signal having a frequency controlled on at least said additive and integral information signal.

7. A clock formation circuit as set forth in claim 6, and wherein said envelope signal output means comprises a pair of transistors connected in series to each other so that said transistors have emitter connected through respective capacitors connected to each other and bases to which said phase difference information signal is applied and having output terminals provided at connections of said emitters and said capacitors to provide said first and second envelope signals, respectively.

8. A clock formation circuit as set forth in claim 7, and wherein said formation clock signal output means comprises voltage control oscillator including a variable capacitor diode across which are applied an addition signal of said first and second envelope signals and said additive and integral signal thereof.

* * * * *